(12) United States Patent
Choi et al.

(10) Patent No.: US 8,354,776 B2
(45) Date of Patent: Jan. 15, 2013

(54) APPARATUS FOR GENERATING ELECTRICAL ENERGY AND METHOD FOR MANUFACTURING THE SAME

(75) Inventors: Dukhyun Choi, Hwaseong-si (KR); Jaeyoung Choi, Suwon-si (KR); Sang Woo Kim, Gumi-si (KR)

(73) Assignees: Samsung Electronics Co., Ltd. (KR); Kumoh National Institute of Technology (KR)

( * ) Notice: Subject to any disclaimer, the term of this patent is extended or adjusted under 35 U.S.C. 154(b) by 845 days.

(21) Appl. No.: 12/482,147

(22) Filed: Jun. 10, 2009

(65) Prior Publication Data

US 2010/0156249 A1 Jun. 24, 2010

(30) Foreign Application Priority Data

Dec. 22, 2008 (KR) .................. 10-2008-0131376

(51) Int. Cl.
*H01L 41/08* (2006.01)
(52) U.S. Cl. ........................... 310/339; 310/338
(58) Field of Classification Search .......... 310/339, 310/338; 257/43; 977/448; *H01L 41/08*
See application file for complete search history.

(56) References Cited

U.S. PATENT DOCUMENTS

| 8,039,834 B2 * | 10/2011 | Wang et al. | 257/43 |
| 2007/0023621 A1 | 2/2007 | Blick et al. | |
| 2008/0067618 A1 | 3/2008 | Wang et al. | |
| 2009/0115293 A1 * | 5/2009 | Wang et al. | 977/948 |
| 2010/0117488 A1 * | 5/2010 | Wang et al. | 310/339 |
| 2010/0141095 A1 * | 6/2010 | Park | 310/339 |

OTHER PUBLICATIONS

Qin et al; "Microfibre-nanowire hybrid structure for energy scavenging"; Nature; vol. 451; Feb. 2008; pp. 809-813.
Wang et al; "Direct-Current Nanogenerator Driven by Ultrasonic Waves" Science; vol. 316, Apr. 2007, pp. 102-105.
Lei et al; "Ordered Arrays of Nanostructures and Applications in High-Efficient Nano-Generators"; Advanced Engineering Materials; vol. 9; No. 5; 2007; pp. 343-348.
Gao et al; "Nanowire Piezoelectric Nanogenerators on Plastic Substrates as Flexible Power Sources for Nanodevices" Advanced Materials, 2007, 19, pp. 67-72.
U.S. Appl. No. 13/034,041 "Apparatus for Generating Electrical Energy and Method for Manufacturing the Same" filed Feb. 24, 2011.
U.S. Appl. No. 12/408,274 "Apparatus for Storing Energy and Method for Manufacturing the Same" filed Mar. 20, 2009.
U.S. Appl. No. 12/535,967 "Apparatus for Generating Electrical Energy and Method for Manufacturing the Same" filed Aug. 5, 2009.

* cited by examiner

*Primary Examiner* — Thomas Dougherty
*Assistant Examiner* — Karen B Addison
(74) *Attorney, Agent, or Firm* — Cantor Colburn LLP

(57) ABSTRACT

An apparatus for generating electrical energy may include; a first electrode, a second electrode spaced apart from the first electrode, the second electrode having a substantially planar flat plate shape, a conductor which electrically connects the first and second electrodes, and a nanowire disposed on the first electrode, the nanowire including a deformable piezoelectric material, wherein a Schottky contact is formed between the nanowire and the second electrode as the nanowires is deformed.

12 Claims, 11 Drawing Sheets

APPARATUS FOR GENERATING ELECTRICAL ENERGY AND METHOD FOR MANUFACTURING THE SAME

CROSS-REFERENCE TO RELATED APPLICATION

This application claims priority to Korean Patent Application No. 10-2008-131376, filed on Dec. 22, 2008, and all the benefits accruing therefrom under 35 U.S.C. §119, the contents of which in its entirety are herein incorporated by reference.

BACKGROUND

1. Field

Exemplary embodiments relate to an apparatus for generating electrical energy and a method for manufacturing the apparatus for generating electrical energy.

2. Description of the Related Art

A typical touch sensor detects a stress applied to devices, and may be used in a touchscreen device or other applications. When a user touches the screen with a finger or other body part, the touch sensor detects the stress applied to the screen and registers the applied stress as an input signal.

In such a touch sensor, a voltage may be applied to one or more edge portions of a screen. When a user's finger or body part contacts the screen, the stress applied to the screen from the finger or body part may be detected as a resistance change or voltage drop.

SUMMARY

Exemplary embodiments may provide an apparatus for generating electrical energy capable of generating electrical energy when applied with a stress and a method for manufacturing the apparatus for generating electrical energy.

According to an exemplary embodiment, an apparatus for generating electrical energy includes; a first electrode, a second electrode spaced apart from the first electrode, the second electrode having a substantially planar flat plate shape, a conductor which electrically connects the first and second electrodes, and a nanowire disposed on the first electrode, the nanowire including a deformable piezoelectric material, wherein a Schottky contact may be formed between the nanowire and the second electrode as the nanowire is deformed.

According to another exemplary embodiment, a method for manufacturing an apparatus for generating electrical energy includes; disposing a nanowire made of a piezoelectric material on a first electrode layer, preparing a second electrode layer having a substantially planar flat plate shape, the second electrode layer being spaced apart from the first electrode layer, locating the nanowire in proximity to the second electrode layer, and electrically connecting the first and second electrode layers.

BRIEF DESCRIPTION OF THE DRAWINGS

The above and other aspects, features and advantages of the disclosed exemplary embodiments will become more apparent from the following detailed description taken in conjunction with the accompanying drawings in which.

DETAILED DESCRIPTION

Figure 1:
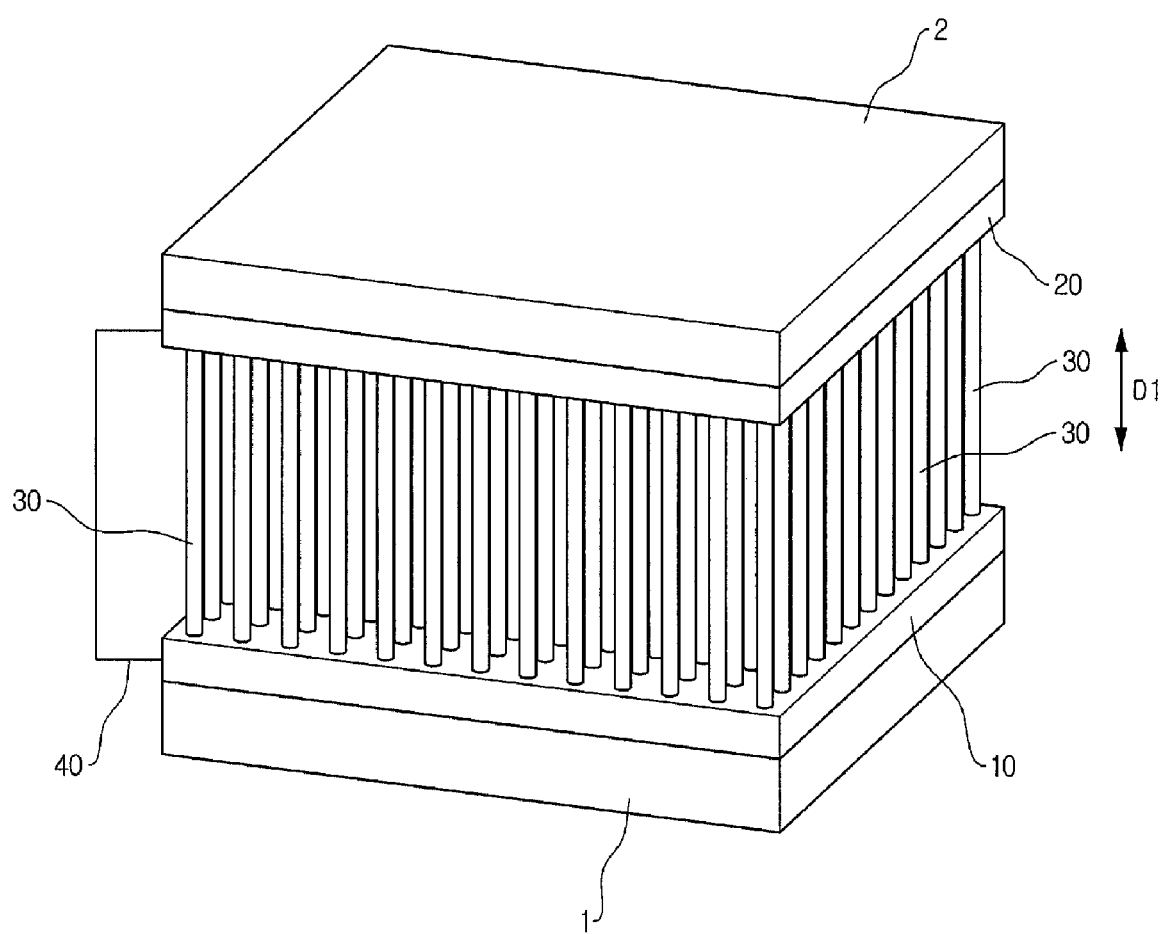
FIG. 1 is a front perspective view illustrating an exemplary embodiment of an apparatus for generating electrical energy.

Exemplary embodiments now will be described more fully hereinafter with reference to the accompanying drawings, in which exemplary embodiments are shown. This disclosure may, however, be embodied in many different forms and should not be construed as limited to the exemplary embodiments set forth therein. Rather, these exemplary embodiments are provided so that this disclosure will be thorough and complete, and will fully convey the scope of this disclosure to those skilled in the art. In the description, details of well-known features and techniques may be omitted to avoid unnecessarily obscuring the presented embodiments. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. Furthermore, the use of the terms a, an, etc. does not denote a limitation of quantity, but rather denotes the presence of at least one of the referenced item. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the exemplary embodiments will be described in detail with reference to the accompanying drawings.

Figure 2:
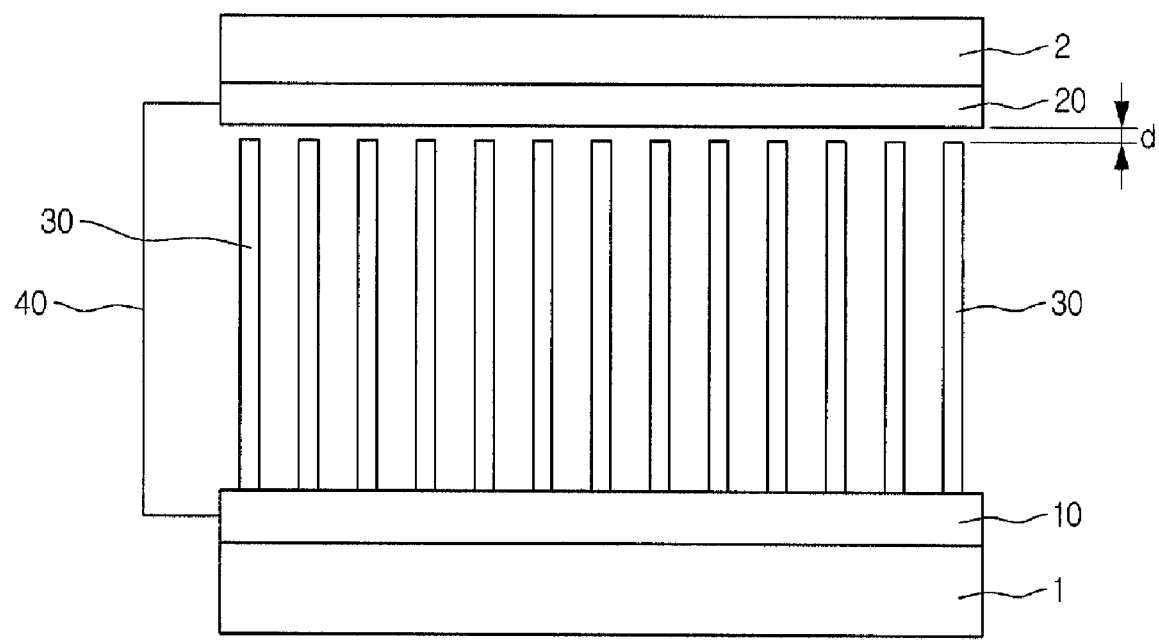
FIG. 2 is a cross-sectional view illustrating the exemplary embodiment of an apparatus for generating electrical energy illustrated in FIG. 1.

FIG. 1 is a front perspective view illustrating an exemplary embodiment of an apparatus for generating electrical energy. FIG. 2 is a cross-sectional view illustrating the exemplary embodiment of an apparatus for generating electrical energy illustrated in FIG. 1.

Referring to FIGS. 1 and 2, an exemplary embodiment of the apparatus for generating electrical energy may include first and second electrodes 10 and 20, at least one nanowire 30 disposed between the first and the second electrodes 10 and 20 and a conductor 40.

The first electrode 10 is a lower electrode for supporting the nanowire 30. In one exemplary embodiment, the first electrode 10 may be formed on a substrate 1. Exemplary embodiments include configurations wherein the first electrode 10 may be a metal film or may a conductive ceramic formed on the substrate 1. Exemplary embodiments of the substrate 1 may be made of glass, silicon (Si), polymer, sapphire, gallium nitride ("GaN"), silicon carbide ("SiC"), or other materials having similar characteristics.

In one exemplary embodiment, the second electrode 20 may be an electrode formed as a flat plate spaced apart from the first electrode 10. The second electrode 20 may be electrically connected to the first electrode 10 via the conductor 40. Similar to the first electrode 10, exemplary embodiments include configurations wherein the second electrode 20 may be formed on a substrate 2. In one exemplary embodiment, the first and the second electrodes 10 and 20 may be formed by forming conductive materials on the respective substrates 1 and 2 using plating, sputtering, e-beam evaporation, thermal evaporation or other similar methods which result in the first and second electrodes 10 and 20 being disposed on the respective substrates 1 and 2.

The first and the second electrodes 10 and 20 may be made of at least one of indium tin oxide ("ITO"), indium zinc oxide ("IZO"), carbon nanotubes ("CNTs"), a conductive polymer, nanofibers, a nanocomposite, a gold-palladium ("Au—Pd") alloy, gold (Au), palladium (Pd), platinum (Pt), ruthenium (Ru), or other materials having similar characteristics.

In addition, the second electrode 20 may be made of a material having a second work function. As used herein, a work function may refer to the energy needed to remove an electron from the surface of a material into a vacuum. In one exemplary embodiment, a second electrode 20 made of Pt may have a work function of about 5.8 eV, in another exemplary embodiment, a second electrode 20 made of ITO may have a work function of about 4.7 eV, and in yet another exemplary embodiment, a second electrode 20 made of CNTs may have a work function of from about 4.8 to about 5.8 eV.

At least one of the first and the second electrodes 10 and 20 may be a flexible electrode that can be deformed by an applied stress. Furthermore, at least one of the first and second electrodes 10 and 20 may be a transparent electrode.

The substrates 1 and 2 on which the first and the second electrodes 10 and 20 are formed, respectively, may also be made of flexible materials that can be deformed by an applied stress. Furthermore, each of the substrates 1 and 2 may be made of a transparent material, exemplary embodiments of which may include glass.

At least one nanowire 30 may be disposed between the first and the second electrodes 10 and 20. The at least one nanowire 30 may extend in a direction D1 substantially perpendicular to at least one of the first and the second electrodes 20. The number of the nanowires 30 illustrated in FIGS. 1 and 2 is only an example, and the number of the nanowires 30 may be different depending on the size and applications of the apparatus.

In one exemplary embodiment, the nanowire 30 may be grown on the first electrode 10. Growing the nanowire 30 on the first electrode 10 rather than directly on the substrate 1 may present several advantages. In one exemplary embodiment, a conductivity of a nanowire energy generating system may be improved over an embodiment wherein the nanowires is grown directly on the substrate 1, since the nanowire 30 is formed on the conductive first electrode 10. Furthermore, it may become easier to control the growth of the nanowire 30, e.g., the nanowire 30 may be grown vertically on the first electrode 10. Furthermore, a uniformity of the shapes or longitudinal directions of the nanowires 30 may be improved.

The nanowire 30 formed on the first electrode 10 may be spaced apart from the second electrode 20 with a predetermined spacing 'd' as shown in FIG. 2. The spacing 'd' between the nanowire 30 and the second electrode 20 may be determined so that the nanowire 30 may contact the second electrode 20 when a stress is applied to the second or first electrode 20 or 10. Alternative exemplary embodiments include configurations wherein the nanowire 30 may contact the second electrode even when a stress in not applied, e.g., the value of 'd' is zero.

When a stress is applied partially or entirely to the apparatus for generating electrical energy having the aforementioned construction, the distance between the first and the second electrodes 10 and 20 may be at least partially changed. Accordingly, the shape of the nanowire 30 disposed between the first and the second electrodes 10 and 20 may be deformed as shown in detail with respect to FIG. 3.

According to the present exemplary embodiment, when the distance between the first and the second electrodes 10 and 20 decreases, the nanowire 30 disposed on the corresponding location may be compressed and bent in the lengthwise direction D1. The bent nanowire 30 exhibits a piezoelectric effect. Accordingly, each portion of the nanowire 30 may have a predetermined electrical potential according to the applied compressive stress or tensile stress.

Exemplary embodiments of the material having piezoelectric effect, as used in the nanowire 30, may include zinc oxide ("ZnO") and other materials with similar characteristics. When a nanowire 30 made of ZnO is bent, each portion inside the nanowire 30 may have an electrical potential due to an asymmetric crystalline structure of ZnO. In addition to ZnO, exemplary embodiments of the nanowire 30 may be made of other materials exhibiting the piezoelectric effect when applied with a stress. Alternative exemplary embodiments include configurations wherein the nanowire 30 is made of lead zirconate titanate ("PZT"), barium titanate ("$BaTiO_3$") or other similar materials.

In one exemplary embodiment, the piezoelectric material constituting the nanowire 30 may have semiconductor characteristics. In addition, the piezoelectric material may be a material having a first work function. Meanwhile, the second electrode 20 may be made of a material having a second work function. Here, the first and the second work functions may be determined so that a Schottky contact is formed between the nanowire 30 and the second electrode 20. In one exemplary embodiment, the first and second work functions are different from one another.

As used herein, the Schottky contact may refer to a contact for forming a Schottky barrier, which is an electric potential barrier corresponding to the difference between the work functions of two materials, on the contact surface of the two materials.

In one exemplary embodiment, when an n-type semiconductor material contacts a metal and the work function of the n-type semiconductor material is smaller than that of the metal, a Schottky barrier may be formed. When the work function of the n-type semiconductor material is greater than that of the metal, an ohmic contact is formed. On the other hand, when a p-type semiconductor material contacts a metal and the work function of the p-type semiconductor material is greater than that of the metal, a Schottky contact may be formed. When the work function of the p-type semiconductor material is smaller than that of the metal, an ohmic contact is formed.

The Schottky contact has a characteristic similar to that of a diode in that a current flows when a voltage is applied in a forward direction to the contact portion between two materials, and current does not flow when the voltage is applied in the reverse direction. When the Schottky contact electrically operates to have the above-mentioned characteristic, it is called a Schottky diode.

In one exemplary embodiment, when an n-type semiconductor material contacts a metal and negative and positive voltages are applied to the n-type semiconductor material and the metal, respectively, a current may be generated which flows from the metal to the n-type semiconductor material. However, when the applied polarities of the voltages are reversed, no current is generated.

The nanowire 30 of the apparatus for generating electrical energy may be made of ZnO, which is a piezoelectric material as previously described. ZnO which is not subjected to doping has the characteristic of the n-type semiconductor, and the work function of ZnO is equal to or smaller than about 4.5 eV. Therefore, when the nanowire 30 made of ZnO contacts a material having a work function greater than that of ZnO, a Schottky contact may be formed. In one exemplary embodiment, a second electrode 20 made of Pt, which has a work function of about 5.8 eV, and a nanowire 30 made of ZnO may form a Schottky contact. Alternative exemplary embodiments include configurations wherein, a second electrode 20 made of ITO or CNT and a nanowire 30 made of ZnO may form a Schottky contact.

When a stress is applied to the nanowire 30 made of the piezoelectric material, the nanowire 30 is deformed, and each portion of the nanowire 30 may have a predetermined electrical potential. When a voltage is applied in a forward direction to the Schottky contact between the second electrode 20 and the nanowire 30, a current may be generated flowing from the second electrode 20 to the nanowire 30.

Figure 3A:
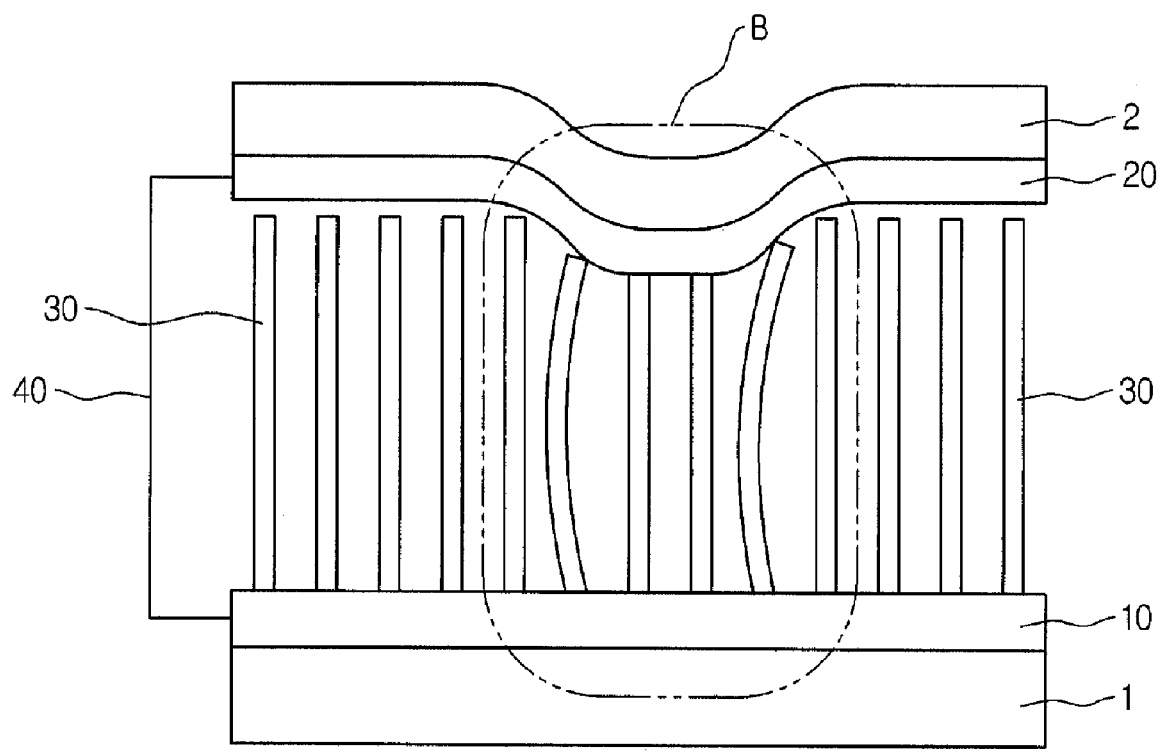
FIG. 3A is cross-sectional view illustrating the exemplary embodiment of an apparatus for generating electrical energy illustrated in FIG. 1, under the application of a stress force.

FIG. 3A is cross-sectional view illustrating the shape of the exemplary embodiment of an apparatus for generating electrical energy illustrated in FIG. 2, which is deformed by a stress applied to the upper portion.

Referring to FIG. 3A, as a stress is applied to the substrate 2, a portion B of the substrate 2 and the second electrode 20 may be bent downward, as illustrated. As a result, the distance between the first and the second electrodes 10 and 20 decreases, and the nanowires 30 disposed between the first and the second electrodes 10 and 20 may be compressed and bent in the longitudinal direction of the nanowires 30.

Figure 3B:
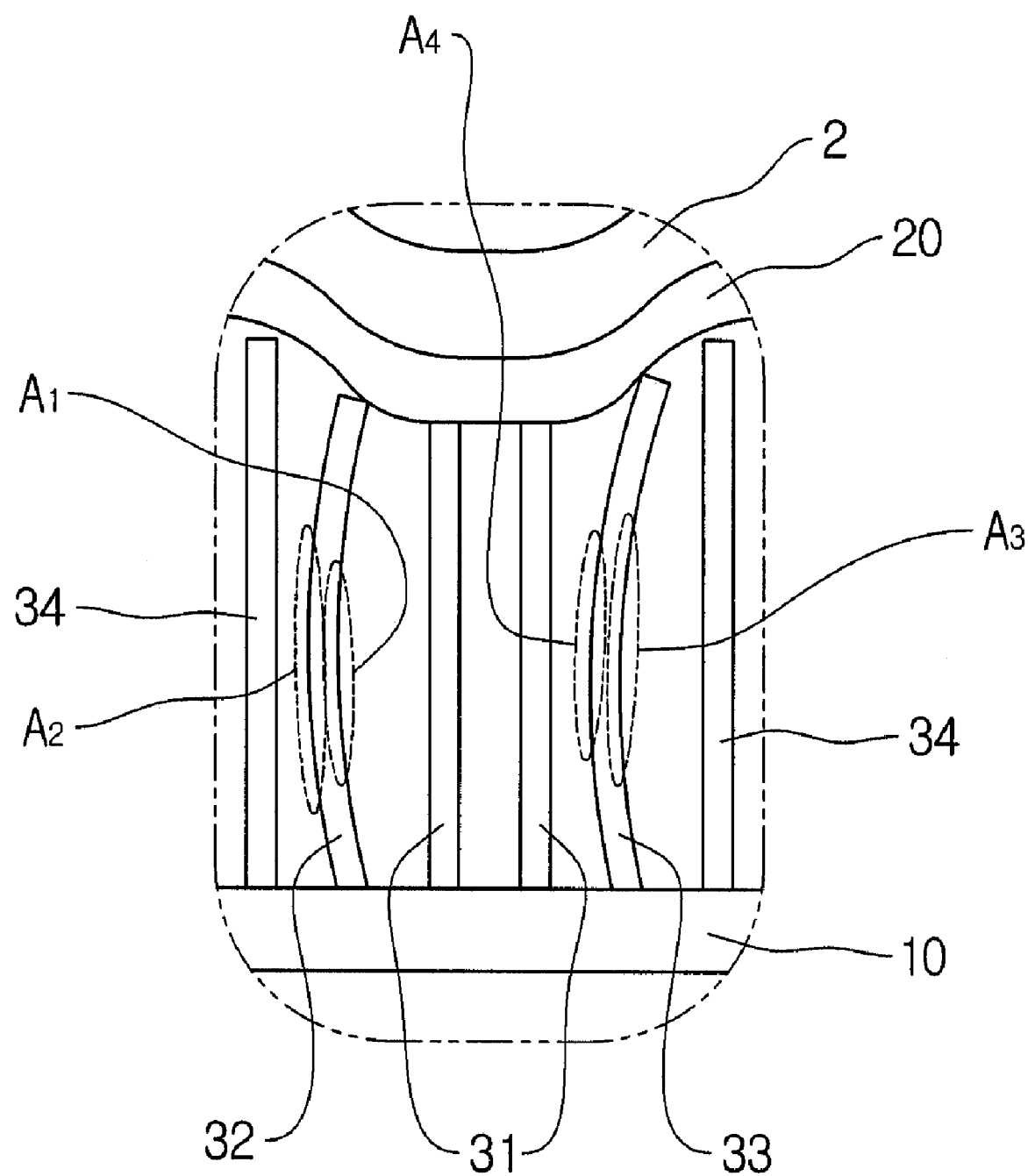
FIG. 3B is an enlarged view illustrating a portion B of the exemplary embodiment of an apparatus illustrated in FIG. 3A.

FIG. 3B is an enlarged view illustrating the portion B of the exemplary embodiment of an apparatus for generating electrical energy illustrated in FIG. 3A.

Referring to FIG. 3B, the nanowire 31 may be compressed by the stress in the longitudinal direction. The nanowire 31 made of the piezoelectric material exhibits a piezoelectric effect in response to the applied stress. In one exemplary embodiment, the nanowire 31 made of ZnO has a negative electrical potential when applied with the compressive stress. On the other hand, the second electrode 20 is in a state without an electrical potential. Accordingly, a forward-biased Schottky diode is formed between the nanowire 31 applied with the compressive stress and the second electrode 20. As a result, a current may be generated flowing from the second electrode 20 to the nanowire 31.

The nanowire 32 is bent by the stress in a direction inclined with respect to the second electrode 20. Here, a compressive stress may be applied to a portion $A_1$ of the nanowire 32, and a tensile stress may be applied to another portion $A_2$. The portion $A_1$ of the nanowire 32 applied with the compressive stress has a negative potential, and the portion $A_2$ of the nanowire 30 applied with the tensile stress has a positive potential.

The portion $A_1$ of the nanowire 32 applied with the compressive stress, e.g., an inner surface of the nanowire 32, contacts the second electrode 20. Accordingly, the portion $A_1$ of the nanowire 32 applied with the compressive stress and the second electrode 20 form a forward-biased Schottky diode. As a result, a current is generated flowing from the second electrode 20 to the nanowire 32.

Similarly, the nanowire 33 is bent by the stress in the direction inclined with respect to the second electrode 20. A compressive stress may be applied to a portion $A_3$ of the nanowire 33, and a tensile stress may be applied to another portion $A_4$. However, unlike the nanowire 32, the portion $A_4$ of the nanowire 33 applied with the tensile stress, e.g., the inner surface of the nanowires 33, contacts the second electrode 20. Accordingly, the nanowire 33 and the second electrode 20 form a reverse-biased Schottky diode, and therefore current does not flow through the nanowire 33.

In addition, current does not flow through the nanowire 34 that does not contact the second electrode 20.

The shapes of the nanowires 31, 32, 33, and 34 deformed by stress may vary depending on the position and magnitude of the stress, and the shapes, directions, and densities of the nanowires 31, 32, 33 and 34, along with other characteristics of the nanowires 31, 32, 33 and 34. In the illustrated exemplary embodiment of FIG. 3B, the Schottky contact is formed between the nanowires 31 and 32 of which the portions applied with the compressive stress contact the second electrode 20, and the second electrode 20, so that a current is generated.

As described above, when the second electrode is applied with the stress and the distance between the first and the second electrodes decreases, a current is generated due to the piezoelectric characteristic of the nanowire and the Schottky contact formed between the nanowire and the second electrode. Accordingly, an electrical energy may be generated by the applied stress.

In FIGS. 3A and 3B, the shape of the second electrode 20 deformed by the applied stress applied to the second substrate 2 is illustrated as an example. However, the same effect may be obtained when the stress is applied to any one or both of the first and second electrodes 10 and 20. In one exemplary embodiment, the same or similar effect may be obtained by pressing a portion of the first and/or the second electrode 10 or 20, or by bending the first and/or the second electrode 10 or 20.

Figure 4:
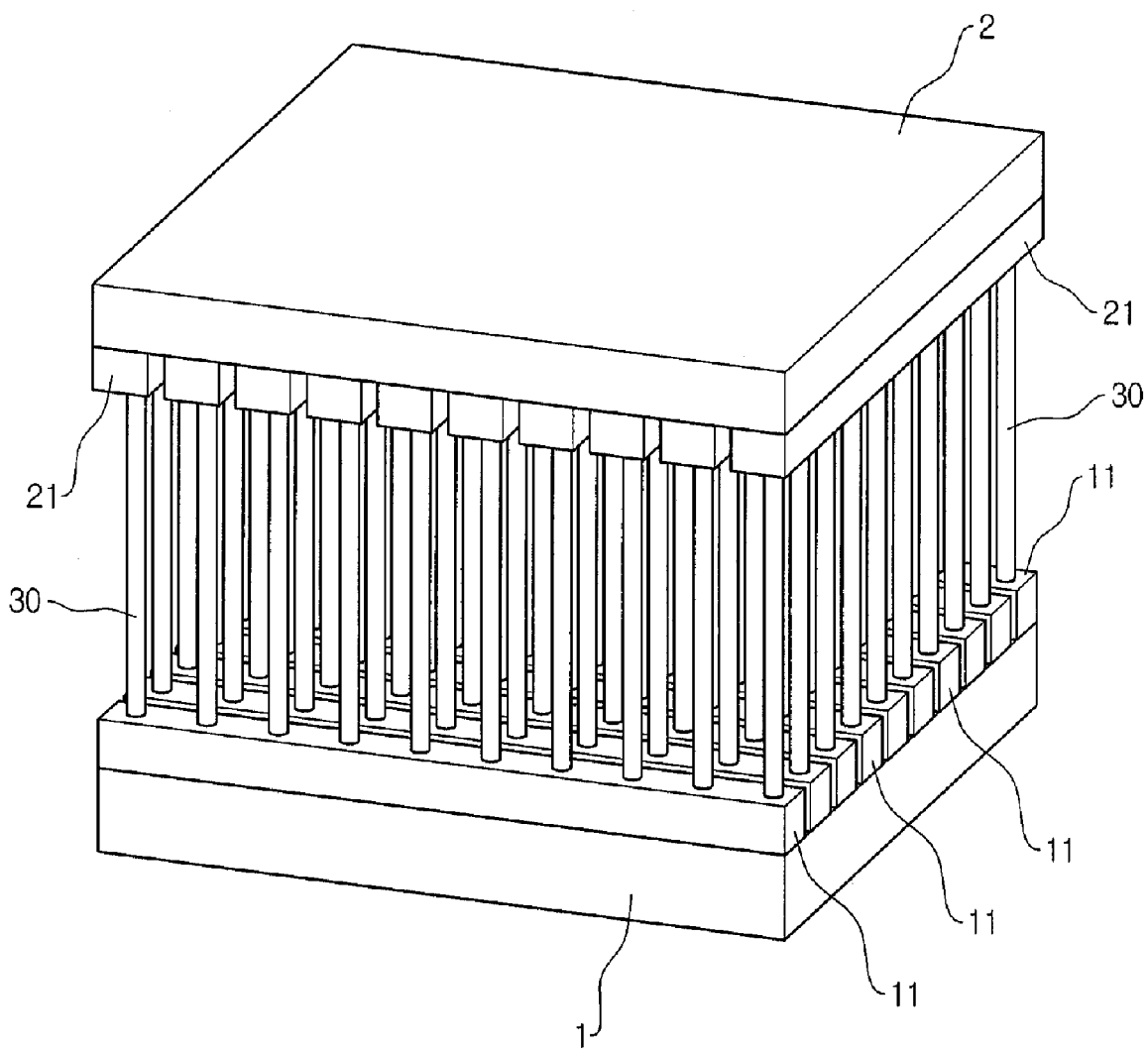
FIG. 4 is a front perspective view illustrating another exemplary embodiment of an apparatus for generating electrical energy.
Figure 5:
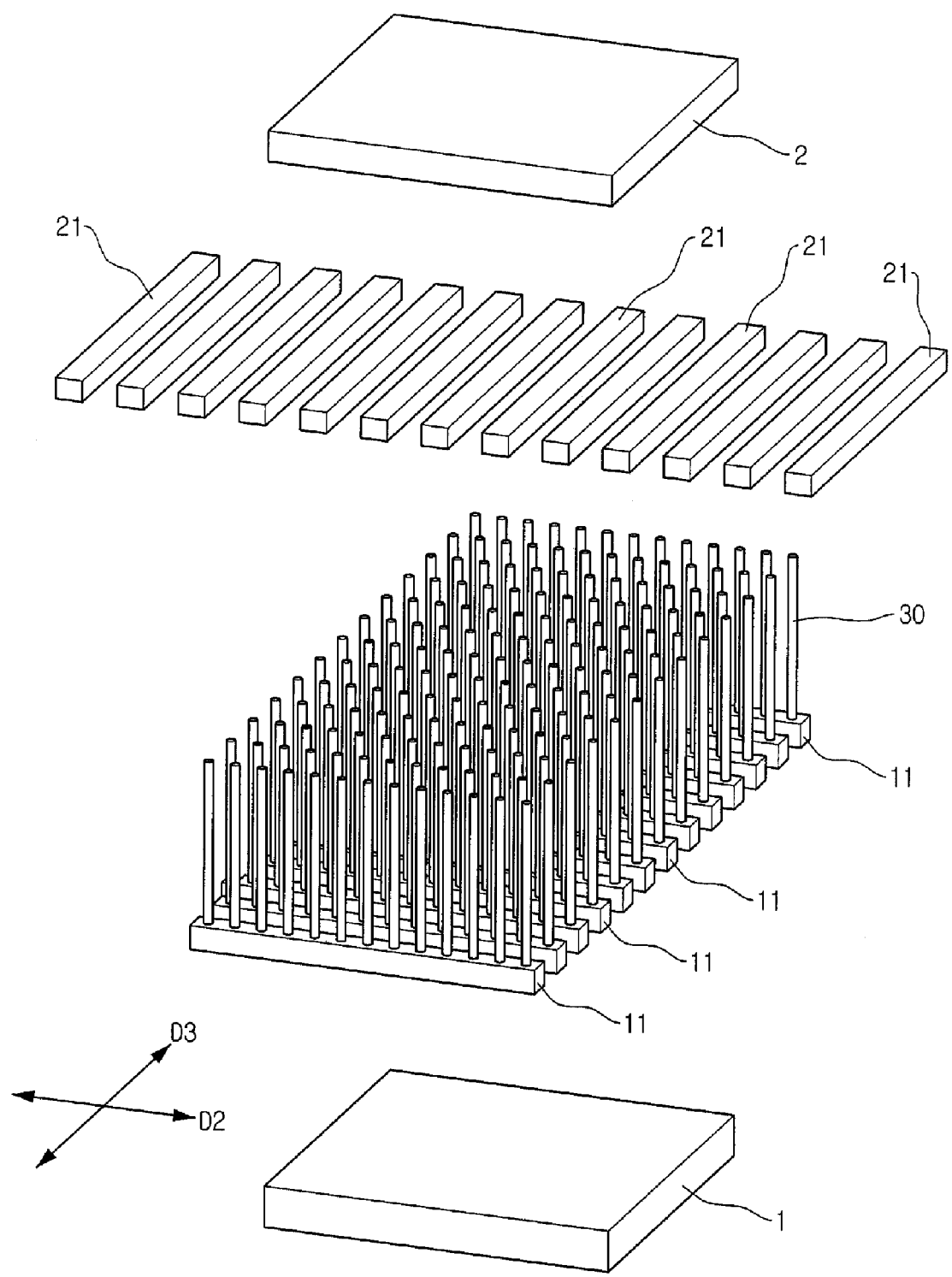
FIG. 5 is an exploded perspective view illustrating the exemplary embodiment of an apparatus for generating electrical energy illustrated in FIG. 4.

FIG. 4 is a front perspective view illustrating another exemplary embodiment of an apparatus for generating electrical energy. FIG. 5 is an exploded perspective view illustrating the exemplary embodiment of an apparatus for generating electrical energy illustrated in FIG. 4.

In FIGS. 4 and 5, structures and functions of substrates 1 and 2 and nanowires 30 are substantially similar to the exemplary embodiment described above with reference to FIGS. 1 to 3. Thus, a detailed description thereof will be omitted for the purpose of brevity.

A plurality of first electrodes 11 and a plurality of second electrodes 21 are provided. The plurality of first electrodes 11 extend on the substrate 1 in a direction D2 and are spaced apart from each other. The plurality of second electrodes 21 extend on the substrate 2 in a direction D3 substantially perpendicular to the direction D2 and are spaced from each other.

Specifically, the plurality of first electrodes 11 and the plurality of second electrodes 21 extend to be substantially perpendicular to each other, thereby forming an array having the shape of a matrix. The numbers of the first and second electrodes 11 and 21 illustrated in FIGS. 4 and 5 are only examples and not limited thereto, and the numbers of the first and second electrodes 11 and 21 may be different depending on the size and applications of the apparatus.

When the apparatus for generating electrical energy having the aforementioned construction is used, the electrode through which current flows from among the plurality of first electrodes 11 and the electrode through which current flows from among the plurality of second electrodes 21 may be detected, so that the position where a stress is applied may be detected. Therefore, in exemplary embodiments wherein the apparatus for generating electrical energy is applied to a touch sensor or the like, the position of the applied stress may be detected.

In FIGS. 4 and 5, the nanowires 30 are disposed on the plurality of first electrodes 11. However, alternative exemplary embodiments include configurations wherein the nanowires 30 may be disposed only on the regions where the first and the second electrodes 11 and 21 intersect with each other.

Moreover, in FIGS. 4 and 5, the second electrodes 21 may extend in a direction substantially perpendicular to the first electrodes 11, as described above. However this is only an exemplary embodiment, and the second electrodes 21 may extend in a direction inclined, or angled, with respect to the direction D2 in which the first electrodes 11 extend.

Figure 6:
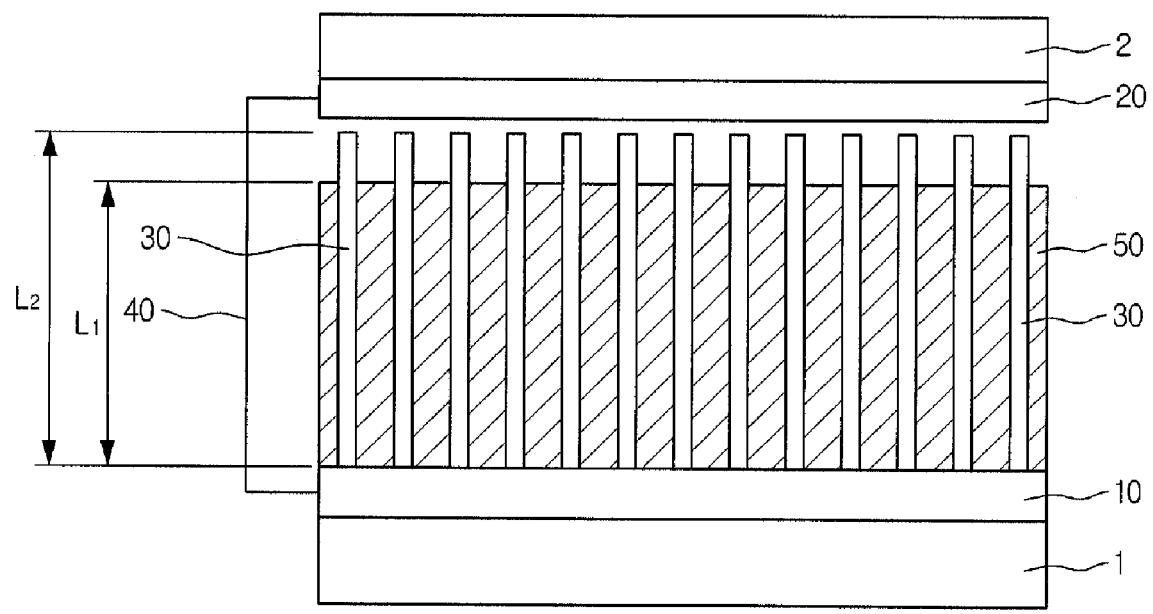
FIG. 6 is cross-sectional view illustrating another exemplary embodiment of an apparatus for generating electrical energy.

FIG. 6 is a cross-sectional view illustrating another exemplary embodiment of an apparatus for generating electrical energy.

In FIG. 6, the structures and functions of substrates 1 and 2, first and second electrodes 10 and 20, and nanowires 30 are substantially similar to the exemplary embodiment described above with reference to FIGS. 1 to 3. Thus, a detailed description thereof will be omitted for the purpose of brevity.

An elastic material 50 may be disposed between the first and the second electrodes 10 and 20. The elastic material 50 may prevent the nanowire 30 from being broken when the apparatus for generating electrical energy is pressed or bent. Accordingly, a durability and reliability of the apparatus for generating electrical energy may be improved.

In one exemplary embodiment, the elastic material 50 may have a relatively high elasticity. At the same time, the elastic material 50 may be made of a material flexible enough to allow the nanowire 30 to be bent. In one exemplary embodiment, the elastic material 50 may be formed of at least one of silicone, polydimethylsiloxane ("PDMS"), and urethane, or other materials having similar characteristics.

If the nanowire 30 is completely covered with the elastic material 50, the nanowire 30 may not contact the second electrode 20. Therefore, in one exemplary embodiment a first distance $L_1$ between the first electrode 10 and a top surface of the elastic material 50 may be equal to or shorter than a second distance $L_2$ between the first electrode 10 and the top surface of the nanowire 30. As a result, an end portion of the nanowire 30 may be exposed, so that the nanowire 30 may be bent to contact the second electrode 20.

The exemplary embodiment of an apparatus for generating electrical energy described above may be used for electronic devices for detecting a stress, such as a touch sensor. In addition, the apparatus for generating electrical energy may be used for display devices such as touch panels and touch screens, robot skins, and other various uses.

FIGS. 7A to 7H are cross-sectional views illustrating an exemplary embodiment of a method for manufacturing the exemplary embodiment of an apparatus for generating electrical energy.

Figure 7A:
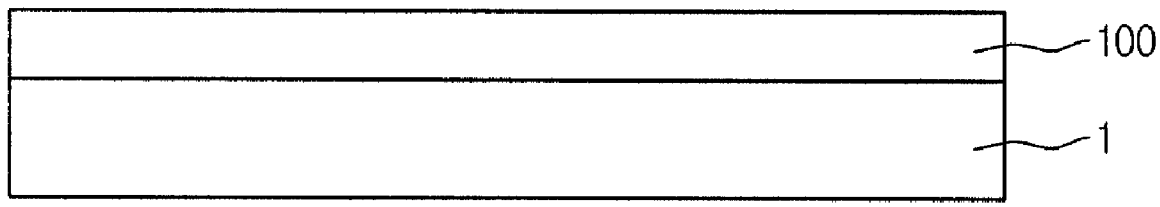
FIGS. 7A to 7H are cross-sectional views illustrating an exemplary embodiment of a method for manufacturing an apparatus for generating electrical energy.

Referring to FIG. 7A, a first electrode layer 100 may be disposed on a substrate 1. Exemplary embodiments of the substrate 1 may be made of glass, silicon, polymer, or other materials having similar characteristics as described above. Exemplary embodiments include configurations wherein the first electrode layer 100 may be made of a flexible conductive material which may be deformed by an applied stress. In addition, exemplary embodiments include configurations wherein the first electrode layer 100 may be made of a transparent material.

In one exemplary embodiment, the first electrode layer 100 may made of at least one of ITO, CNTs, a conductive polymer, nanofibers, and a nanocomposite. Alternative exemplary embodiments include configurations wherein the first electrode layer 100 may be made of at least one of an Au—Pd alloy, Au, Pd, Pt, and Ru. The first electrode layer 100 may serve as a lower electrode for supporting the nanowire which is to be disposed thereon in a later process.

Figure 7B:
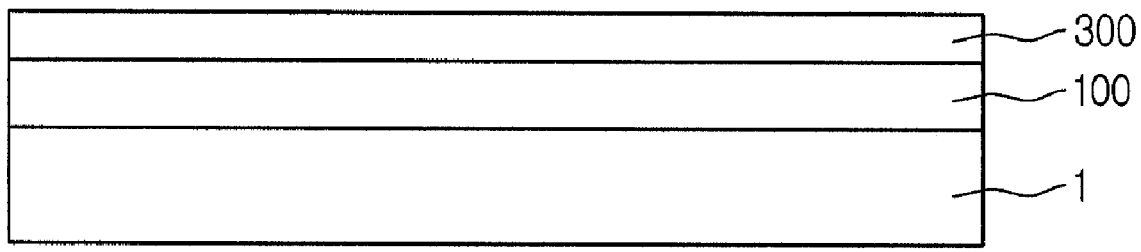

Referring to FIG. 7B, a nanomaterial layer 300 may be disposed on the first electrode layer 100. The nanomaterial layer 300 may be disposed on the first electrode layer 100 by spin coating or the like to have a small thickness, e.g., in one exemplary embodiment the nanomaterial layer 300 may have a thickness of about 3 nm to about 50 nm. In one exemplary embodiment, the nanomaterial layer 300 may be formed of zinc acetate.

Figure 7C:
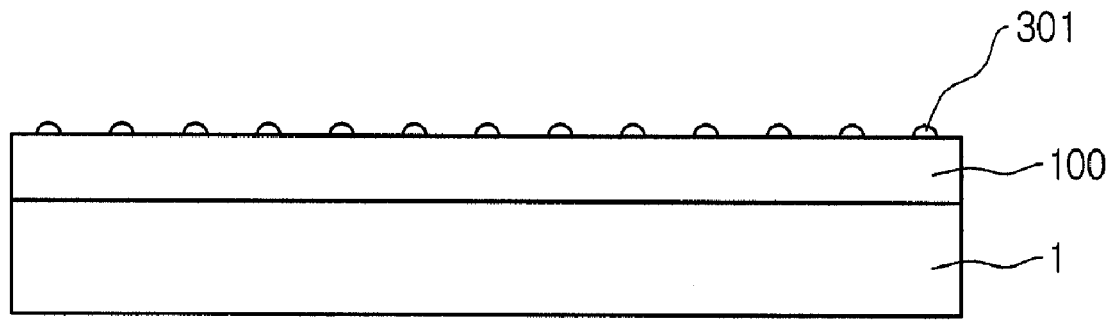

Referring to FIG. 7C, the substrate 1 on which the nanomaterial layer 300 (see FIG. 7B) has been formed may be heated to form one or more nanonuclei 301. As a non-limiting example, the nanonuclei 301 may be formed by heating the substrate 1 on which the nanomaterial layer 300 (see FIG. 7B) has been formed at a temperature of about 100° C. to about 200° C. followed by drying.

Figure 7D:
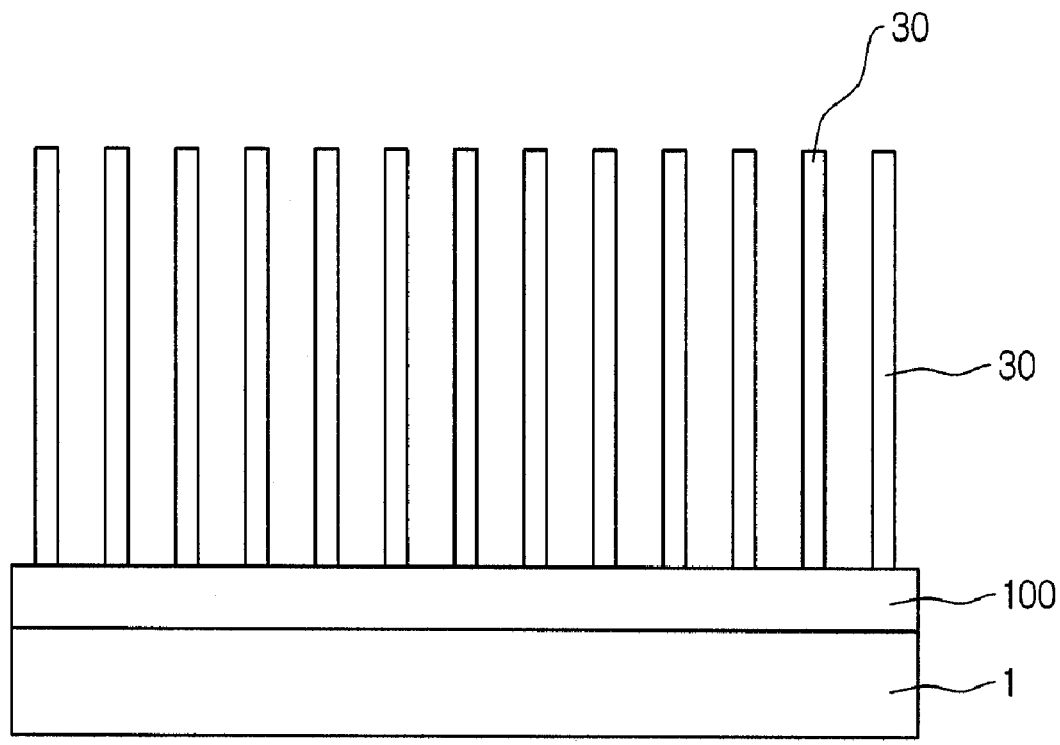

Referring to FIG. 7D, the substrate 1 on which the nanonuclei 301 has been formed may be immersed in a solution of a nanomaterial so as to grow a nanowire 30 from each nanonucleus 301. The nanowire 30 may be made of a piezoelectric material, having a first work function as described in detail above.

Figure 7E:
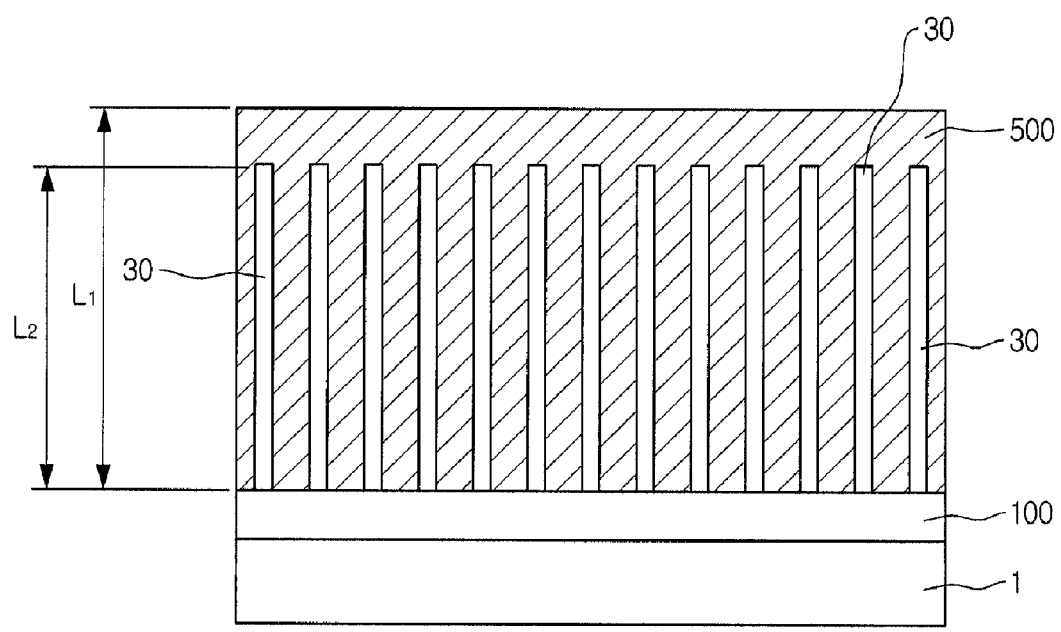

Referring to FIG. 7E, in one exemplary embodiment, an elastic material layer 500 may be disposed on the first electrode 100 on which the nanowire 30 has been formed. The elastic material layer 500 may prevent the nanowire 30 from being broken. The elastic material layer 500 may have a relatively high elasticity. At the same time, the elastic material layer may be made of a material flexible enough to allow the nanowire 30 to be bent. In one exemplary embodiment, the elastic material layer 500 may be formed of at least one of silicone, PDMS, and urethane, or other materials having similar characteristics. Alternative exemplary embodiments include configurations wherein the formation of the elastic material layer 500 may be omitted.

Exemplary embodiments include configurations wherein the elastic material layer 500 may be disposed on the first electrode layer 100 using spin coating, dip coating, nozzle printing, or other similar methods. In one exemplary embodiment, the elastic material layer 500 may be disposed using the nozzle printing method by spraying a material on the first electrode layer 100 with a fine nozzle and drying the sprayed material.

In FIG. 7E, a first distance $L_1$ between the first electrode layer 100 and a top surface of the elastic material layer 500 is greater than a second distance $L_2$ between the first electrode layer 100 and the top surface of the nanowire 30. Alternatively, the first distance $L_1$ may be equal to or shorter than the second distance $L_2$.

Figure 7F:
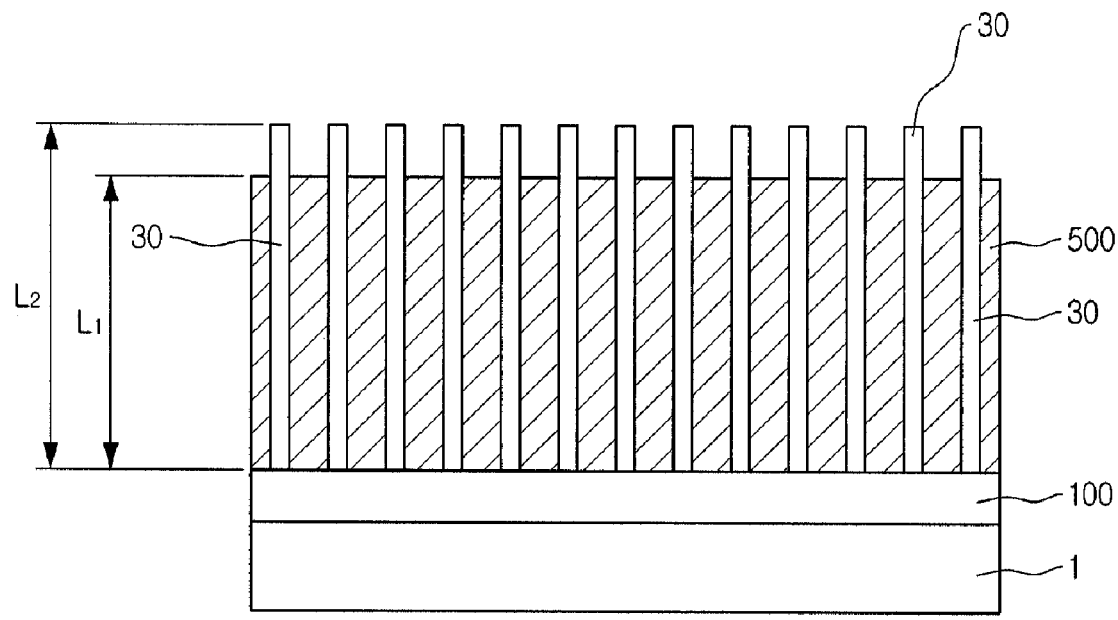

Referring to FIG. 7F, in the exemplary embodiment wherein the elastic material layer is formed so the first distance $L_1$ is greater than the second distance $L_2$, a portion of the elastic material layer 500 may be removed to expose the end portion of the nanowire 30. This is to ensure contact between the nanowires 30 and an electrode as discussed above. Accordingly, a portion of the elastic material layer 500 may be removed so that the first distance $L_1$ is equal to or shorter than the second distance $L_2$. Exemplary embodiments include configurations wherein the elastic material layer 500 may be partially removed by etching methods using ultraviolet ("UV") radiation or oxygen ($O_2$) plasma, or by using other similar etching methods.

In the alternative exemplary embodiment where the elastic material layer 500 is initially formed so that the first distance $L_1$ is equal to or shorter than the second distance $L_2$, the procedure of removing a portion of the elastic material layer 500 may be omitted.

Figure 7G:
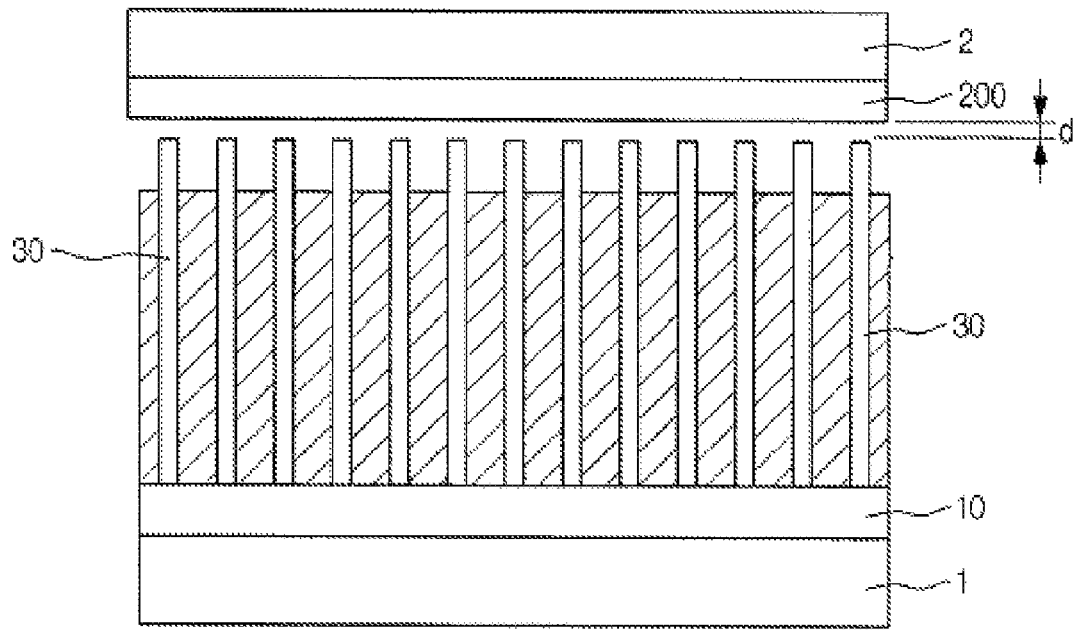

Referring to FIG. 7G the nanowire 30 may be brought into proximity to the second electrode layer 200. The second electrode layer 200 may be disposed on the substrate 2. In one exemplary embodiment, the second electrode layer 200 may be formed by forming a conductive material on the substrate 2 using plating, sputtering, e-beam evaporation, thermal evaporation, or other similar methods.

The second electrode layer 200 may be made of a material having a second work function. The values of the first and the second work functions may be determined so that a Schottky contact may be formed when the nanowire 30 contacts the second electrode layer 200. The nanowire 30 may be spaced apart from the second electrode layer 200 with a predetermined spacing 'd'. Alternatively, the nanowire 30 may contact the second electrode layer 200, e.g., the value of 'd' may be zero.

In one exemplary embodiment, the second electrode layer 200 may have a shape of a flat plate. Since the second electrode layer 200 has a relatively simple shape, the manufacturing process of the apparatus for generating electrical energy may be simplified as compared with that using an electrode having a special structure. As a result, a time needed to manufacture the apparatus for generating electrical energy may be reduced. In addition, when the second electrode layer 200 is formed as the flat plate, the manufacture of a transparent system may become relatively simple.

Figure 7H:
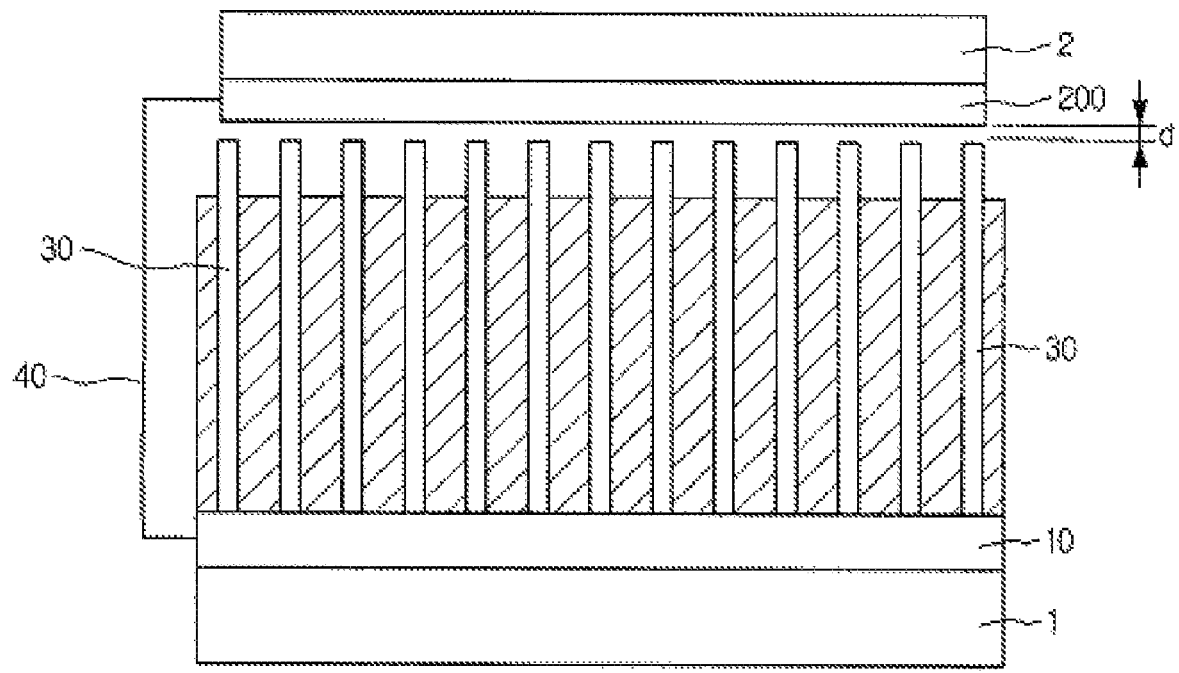

Referring to FIG. 7H, the first and the second electrode layers 100 and 200 may be electrically connected to each other by a conductor 40, thereby completing the apparatus for generating electrical energy.

While the exemplary embodiments have been shown and described, it will be understood by those skilled in the art that various changes in form and details may be made thereto without departing from the spirit and scope of this disclosure as defined by the appended claims.

In addition, many modifications can be made to adapt a particular situation or material to the teachings of this disclosure without departing from the essential scope thereof. Therefore, it is intended that this disclosure not be limited to the particular exemplary embodiments disclosed as the best mode contemplated for carrying out this disclosure, but that this disclosure will include all embodiments falling within the scope of the appended claims.

What is claimed is:

1. An apparatus for generating electrical energy comprising:
   a first electrode;
   a second electrode spaced apart from the first electrode, the second electrode having a substantially planar flat plate shape;
   a conductor which electrically connects the first and second electrodes;
   a nanowire disposed on the first electrode, the nanowire including a deformable piezoelectric material; and
   first and second substrates connected to the first and second electrodes, respectively, wherein a Schottky contact is formed between the nanowire and the second electrode as the nanowire is deformed.

2. The apparatus according to claim 1, wherein
the nanowire includes an n-type semiconductor material having a first work function,
the second electrode includes a material having a second work function, and
the second work function is greater than the first work function.

3. The apparatus according to claim 1, wherein
the nanowire includes a p-type semiconductor material having a first work function,
the second electrode includes a material having a second work function, and
the first work function is greater than the second work function.

4. The apparatus according to claim 1, wherein
at least one of the first and second electrodes is a flexible electrode, and
the nanowire deforms as a distance between the first and second electrodes decreases.

5. The apparatus according to claim 1, wherein at least one of the first and second electrodes is a transparent electrode.

6. The apparatus according to claim 1, wherein at least one of the first and second substrates is made of a flexible material.

7. The apparatus according to claim 6, wherein at least one of the first and second substrates is made of a transparent material.

8. The apparatus according to claim 1, wherein
the first electrode includes a plurality of first electrodes,
the second electrode includes a plurality of second electrodes,
each of the plurality of first electrodes are spaced apart from each other and extend in one direction, and
each of the plurality of second electrodes are spaced apart from each other and extend in a direction substantially perpendicular to the one direction.

9. The apparatus according to claim 1, further comprising:
an elastic material disposed between the first and second electrodes,
wherein a first distance between the first electrode and a top surface of the elastic material is equal to or shorter than a second distance between the first electrode and a top surface of the nanowire.

10. The apparatus according to claim 1, wherein the first and second electrodes comprise at least one selected from the group consisting of indium tin oxide, carbon nanotubes, a conductive polymer, nanofibers, a nanocomposite, a gold-palladium (Au—Pd) alloy, gold (Au), palladium (Pd), platinum (Pt), ruthenium (Ru) and combinations thereof.

11. The apparatus according to claim 1, wherein the nanowire comprises at least one selected from the group consisting of zinc oxide, lead zirconate titanate, barium titanate and combinations thereof.

12. The apparatus according to claim 1, wherein the first electrode has a substantially planar flat plate shape.

* * * * *